United States Patent [19]

Board

[11] 4,449,140

[45] May 15, 1984

[54] SEMI-CONDUCTOR BARRIER SWITCHING DEVICES

[75] Inventor: Kenneth Board, Mayals, England

[73] Assignee: National Research Development Corporation, London, England

[21] Appl. No.: 334,382

[22] Filed: Dec. 24, 1981

[51] Int. Cl.$^3$ .................... H01L 29/00; H01L 29/90; H01L 29/48; H01L 29/12

[52] U.S. Cl. ........................ 357/7; 357/13; 357/15; 357/33; 357/57; 357/58

[58] Field of Search .................. 357/57, 58, 33, 13, 357/7, 15, 38, 37

[56] References Cited

U.S. PATENT DOCUMENTS 3,566,206  2/1971  Bartelink et al. .................... 357/57
4,149,174  4/1979  Shannon ............................... 357/13

FOREIGN PATENT DOCUMENTS 2056165  3/1981  United Kingdom .
2056166  3/1981  United Kingdom .

OTHER PUBLICATIONS

T. Yamamoto and M. Morimoto, "Thin-MIS-Structure Si Negative-Resistance Diode," Applied Physics, vol. 20, 1972 pp. 269–270.
H. Kroger and H. Wegener, "Bistable Impedance States in MIS Structures Through Controlled Inversion", Appl. Phys. Letts., 1973, vol. 23, pp. 397–399.
M. Green and J. Shewchun, "Current Multiplication in Metal–Insulator–Semiconductor MIS Tunnel Diodes", Sol. St. Electronics, 1974, vol. 17, pp. 349–365.
Board et al. "Theory of Switching in Polysilicon–n–p+ Silicon Structures" Electronic Letters vol. 17, No. 1, pp. 41–42, Jan. 1981.
Malik et al. "Planar Doped Barriers in GaAs by Molecular Beam Epitaxy," Electronics Letters, vol. 16, No. 22, pp. 836–838, Oct. 1980.
Shannon, J. M., "A New Majority Carrier Diode–The Camel Diode" Proceeding 11th Conf. Solid State Devices, Tokyo 1979, Jap. Journal Appl. Phys. vol. 19, Supp. 19-1, pp. 301–304 (1980).
C. Allyn, A. Gossard and W. Wiegmann, "New Rectifying Semiconductor Structure by Molecular Beam Epitazy", Appl. Phys. Letts. 1980, vol. 36 (5), pp. 373–376.

Primary Examiner—Martin H. Edlow
Assistant Examiner—J. L. Badgett
Attorney, Agent, or Firm—Cushman, Darby & Cushman

[57] ABSTRACT

Two and three terminal semi-conductor barrier switching devices are disclosed in which a semi-conductor junction or a Schottky barrier is used to inject carriers towards a barrier formed by a narrow layer doped to have majority carriers of the type injected. In the non-conducting state the barrier prevents conduction but as an applied bias is increased the barrier begins to allow carriers of the opposite type to pass releasing the first mentioned carriers and causing the barrier height to be reduced. This action becomes regenerative with increasing bias and after passing through a negative resistance region, the device enters its conducting state. When the third terminal is present the device is made conducting by biasing its third terminal to cause carriers of the first mentioned type to be injected into the barrier region for example from a diffusion adjacent to the third terminal.

13 Claims, 8 Drawing Figures

SEMI-CONDUCTOR BARRIER SWITCHING DEVICES

BACKGROUND OF THE INVENTION

The present invention relates to solid state semi-conductor switching devices having at least two electrodes, the impedance between the two electrodes being relatively very low in one state and very high in the other state.

Solid state switches are known in which a p-n junction is positioned in close proximity to a two-layer system comprising an electrode and a thin layer of silicon dioxide. A further electrode is positioned remote from the other electrode on the other side of the p-n junction. It is the interaction between the junction and the two-layer system which gives the device its switching property. In an alternative known switching device the silicon dioxide is replaced by a semi-insulating layer usually of polycrystalline silicon.

Solid state switches of the types mentioned suffer from two disadvantages: firstly since the interfaces between the electrode and silicon dioxide or polycrystalline material depend on the condition of the surface on which the electrode is deposited, such interfaces have notoriously variable properties from one device to another and suffer large characteristic variation with temperature; and secondly the characteristics of the electrode/oxide or electrode/polycrystal are fixed within a small range for any two interface materials and thus the interface is not amenable to "design" of characteristics.

SUMMARY OF THE INVENTION

According to the present invention there is provided a switching device comprising a body of semi-conductor material, means for injecting carriers of a first type into the body, a first terminal coupled to the said means, a barrier formed by a layer of semi-conductor material in the said body, the layer being of a material which has the first type of carriers as majority carriers, and a second terminal coupled to that region of the said body which is on that side of the barrier remote from the said means, the dimensions of the layer and its composition being such that when the device is unbiassed the layer is substantially depleted of the said majority carriers, and the concentration of any majority carriers of a second type in the said body being not substantially more than twice as great when the device is unbiassed, in the region adjacent to the barrier and between the barrier and the said means than in the region adjacent to the barrier and on that side of the barrier which is remote from the said means.

Since tha barrier performs a roughly analogous function to the above mentioned two layer system but is buried in semi-conductor material the disadvantages of surface deposition are avoided and further since the doping of the semi-conductor bodies is variable within wide limits the barrier characteristics can be designed almost "at will."

The above mentioned condition for concentration of majority carriers of the second type in the said regions is necessary to ensure an 'off state' when biassing is low but such that the said injection means would otherwise provide conduction. When the bias is increased the device switches to its on state in the way described later.

Devices according to the invention may be used as high speed switching elements, for example in read only memories, and since the devices have a negative resistance region they are expected to be useful as oscillators at microwave frequencies. The devices are also optically sensitive and may be used as optically controlled switches particularly at microwave frequencies.

The means for injecting majority carriers is preferably a p-n (or n-p) junction remote from the barrier within the body of semi-conductor material but other means such as a Schottky barrier may be used, and in this case a metal layer is deposited on the semi-conductor body at some distance from the barrier.

The body may be n type material when carriers of the first type are holes, those of the second type are electrons and the barrier is p type material; or the body may be p type material when carriers of the first type are electrons, those of the second type are holes and the barrier is n type material; or the body may be intrinsic material when either carriers of the first and second types are holes and electrons, respectively, and the barrier is p type material, or vice versa.

When the injection means injects holes, the barrier may for example be a highly doped p-type (p+) layer in n-type material. The doping in the n-type material may be high (n+) on one side of the barrier and low (n−) on the other side. In another example the barrier may be doped p-type (p) material is near-intrinsic $\pi$ material, the near-intrinsic material being sandwiched between n type regions.

For power applications, particularly, the switching device may include a third electrode adjacent to, or in contact with, the barrier to inject carriers into the region of the barrier.

The three electrode device has the following advantages: it is expected to be intrinsically fast (having turn-on and turn-off times of the order of nanoseconds or perhaps less), the structure is simpler than the thyristor, its technology in MOS-compatible, it has good reliability, large area operation and large gate to anode current ratios.

BRIEF DESCRIPTION OF THE DRAWINGS

Certain embodiments of the invention will now be described by way of example, with reference to the accompanying drawings, in which.

DESCRIPTION OF EMBODIMENTS

Figure 1:
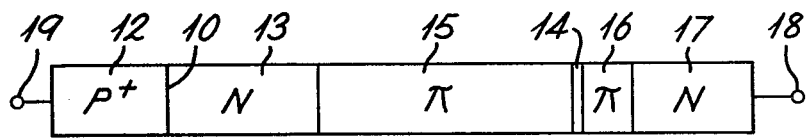
FIG. 1 is a schematic cross section of a two electrode device according to the invention.

In FIG. 1 a junction 10 is formed in a semi-conductor body 11 between a heavily doped p+ type region 12 and an n-type region 13, and a narrow barrier 14 of p type material is formed in between two regions 15 and 16 of intrinsic material. An n type region 17 is located between the region 16 and a terminal 18, another terminal 19 being provided for the region 12.

Figure 2A:
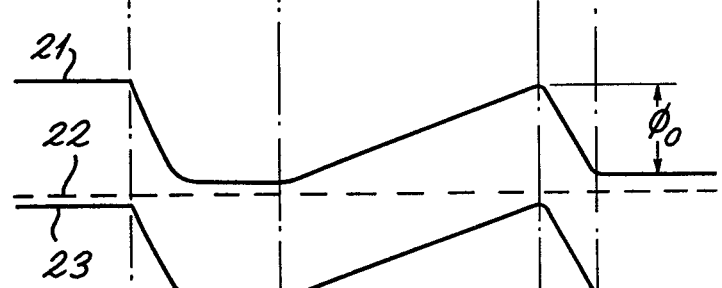
FIGS. 2a, 2b and 2c show energy band diagrams for zero bias, off state and on state, respectively, for the device of FIG. 1, FIGS. 3a and 3b are cross sections of two terminal solid state switches according to the invention.

In the energy band diagram for zero bias shown in FIG. 2a the conduction band energy level is shown at 21, the Fermi level at 22 and the valence band level at 23. The energy barrier 24 due to the junction 10 is shown together with the energy barrier $\phi_o$ due to the barrier 14. The barrier 14 is by virtue of its size and doping substantially completely depleted of holes and therefore negatively charged when the device is zero biassed.

Figure 2B:
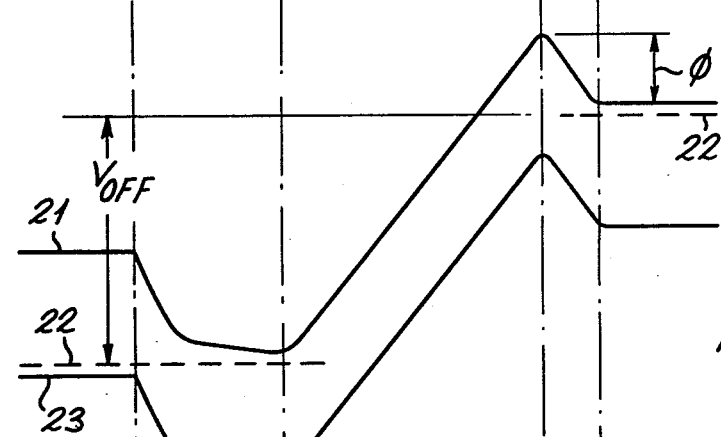
Figure 2C:
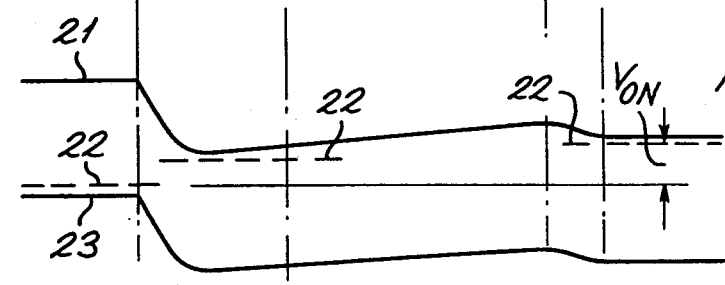

When a bias $V_{OFF}$ is applied which makes the terminal 19 positive with respect to the terminal 18 the junction 10 is forward biassed and the left side as shown in FIG. 2b of the barrier 14 is reverse biassed. The barrier 14 then absorbs virtually all of the applied potential, preventing current flow and providing a high-voltage low-current off state. The region 15 must have a length which is at least twice as long as the region 16 in order for an off state to occur. With increasing bias in the same sense however a rapidly increasing number of electrons are injected over the barrier 14 towards the junction 10. If, in a thermionic mode of operation, the distance to the junction is within a diffusion length then the junction develops a bias to support the higher current flow. Holes are consequently injected from the junction into the barrier. The hole density at the potential minimum of the barrier thus increases with applied bias to support the larger hole current so neutralising some of the negative acceptor charge and reducing the barrier height.

If thermionic electron current is small, reduction of barrier height occurs in a "punch through" mode of operation. In this mode electrons from the space charge region of the barrier 14 punch through to the space charge region of the junction 10.

This reduction in barrier height reinforces the initial electron injection into the junction and if the reduction in barrier height is sufficient to inject a greater number of electrons than caused the barrier height reduction, regenerative action occurs.

In order for the device to switch regeneratively the positive feedback gain must exceed unity. In the thermionic mode, assumming an idealised charge profile, the barrier height $\phi$ (see FIG. 2b) is given by:

$$\phi = \frac{d_1 d_2}{d_1 + d_2} \frac{(Q_A - qp\delta)}{\epsilon_s} - \frac{d_1 V}{d_1 + d_2} \qquad \text{equation 1}$$

where
$\epsilon_s$ is the permittivity of the regions 14 and 15,
V is the applied bias voltage,
$Q_A$ is the charge density in the barrier 14 due to ionized acceptors,
p is the free hole density in the barrier 14,
$\delta$ is the average width of the free hole density (assumed constant), and
$d_1$ and $d_2$ are the lengths of the regions 16 and 15, respectively.

It follows from equation 1 that the barrier height $\phi$ can be reduced by an applied reverse bias V or by the introduction of holes into the potential minimum at the barrier 14. According to the construction of the device of FIG. 1 the switching voltage (that is the value of the voltage V at which the device switches from its off state to its on state) may for example be in the range 1 to 100 volts but is usually less than about 10 volts.

If loop gain G is defined by $\Delta\phi_2/\phi_1$ where $\Delta\phi_2$ is the change in barrier height which results from an initial change $\Delta\phi_1$, it can be shown that $$G = \frac{2\alpha L_p}{C_j k T D_p} \frac{(A^* T^2)^2 e^{\frac{-q\phi}{kT}}}{\left(1 + \frac{q}{kT}(\phi_o - \phi)\right)} \qquad \text{equation 2}$$

where
$\alpha$ is $$\frac{q\delta}{\epsilon_s} \left( \frac{d_1 d_2}{d_1 + d_2} \right) ,$$

$L_p$ is hole diffusion length,
k is Boltzmann's constant,
$A^*$ is the effective Richardson constant for electrons,
T is absolute temperature,
q is electric charge,
$D_p$ is the diffusion coefficient for holes,
$C_j$ is $$\frac{qLN_D}{4D_p} (\sigma V_{th} N_{tj} W)^2,$$

L is the length of the neutral region between the barrier and the junction,
$N_D$ is the density of donor atoms in the junction region,
$\sigma$ is the capture cross section for traps in the junction space charge region,
$V_{th}$ is the thermal velocity for traps in the junction space charge region,
$N_{tj}$ is the trap density for traps in the junction space charge region,
W is the width of the junction space charge region.
When V or p (see equation 1) reduces $\phi$ to the value $\phi_s$ where G=1 regenerative switching occurs, accompanied by an increasingly forward biassed junction and a reducing barrier height. When the barrier reduces to a few kT the derivation of equation 2 is no longer valid, the feedback loop is weakened, the gain falls to unity and the device enters a stable on state in which essentially only the p-n junction is seen. The switching voltage using equation 1 is given by:

$$V_s = \frac{d_1 + d_2}{d_1} (\phi_{BO} - \phi_s)$$

where $G(\phi_s) = 1$, $\phi_{BO} = (d_1 d_2/(d_1+d_2)) \cdot Q_A/\epsilon_s$.

If the current level in the on-state is reduced, the hole density supporting the hole diffusion current reduces and the barrier grows. A reverse regenerative action then occurs leading to the re-establishment of the barrier and the off state.

When transit from the off state to the on state occurs with increasing forward bias voltage, for the junction, the device passes through a negative resistance region.

The device of FIG. 1 is also sensitive to light. Photons reaching the barrier 14 when the junction is forward biassed near to 'switch on', cause electrons to overcome the barrier and pass to the p-n junction. This results in the holes passing back to the barrier so that the hole density increases and the barrier height drops. Provided this drop is sufficient to cause regenerative action the device switches on. When light is removed, the 'on state' holding current increases and regenerative switching off action occurs.

Figure 3A:
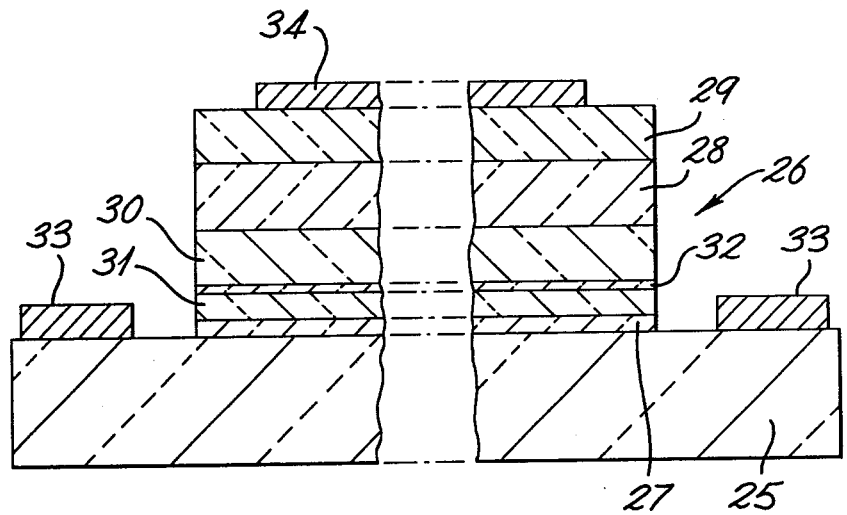

A cross section of a device of the type of FIG. 1 is shown in FIG. 3a. In an example of construction using an n+, Sn doped substrate 25, layers 26 were grown by molecular beam epitaxy in a Varian 360 system. The layers 26 were grown using gallium and arsenic sources with an As$_4$:Ga flux ratio in the range 2 to 3 and a growth rate of approximately 1.5 microns per hour. In the n type layers 27 and 28 silicon was used as the n-dopant, and either magnesium or beryllium was used as the p-dopant in the p type layer 29 forming the p-n junction with the layer 28.

The barrier 32 was formed by p-doping at approximately $2 \times 10^{18}$ cm.$^{-3}$ over a thickness $\delta$ of 100 Å; giving an acceptor area-concentration $Q_A$ of approximately $2 \times 10^{12}$ cm.$^{-2}$.

Conventional Au-Ge ohmic contacts 33 were sintered to the substrate 25 and a contact 34 to the p+ layer was formed either by electroless palladium overlaid with gold or by sintered gold-zinc. The active areas of the device were defined either by wet-etching or ion-milling.

In devices of the type shown in FIG. 3a the layer 29 may contain about $10^{18}$ atoms of dopant per cm.$^3$, the layer 28 may be about 1500 Å in thickness and contain about $10^{17}$ atoms of dopant per cm.$^3$, the intrinsic layer 30 may be about 2000 Å in thickness, the intrinsic layer 31 may be about 200 Å in thickness and the layer 27 may contain about $10^{17}$ atoms of dopant per cm.$^3$.

A Schottky barrier version of the device of FIG. 3a may also be made in which the p-n junction is replaced by a Schottky barrier when a metal layer replaces the layer 29. An evaporated gold contact may be used for this layer.

Figure 3B:
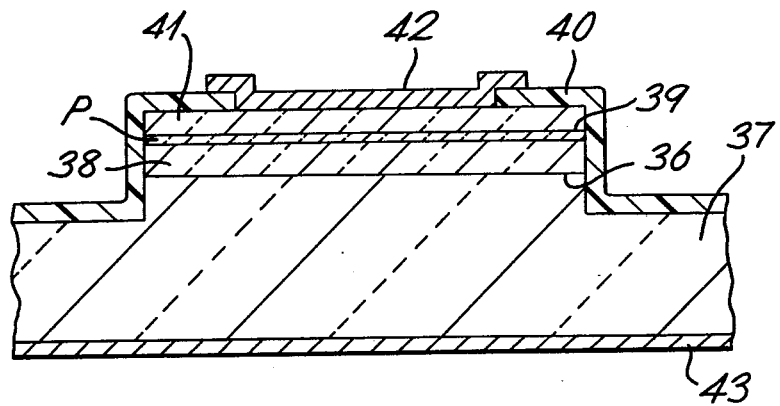

It will be appreciated that other combinations of barriers and junctions may be used and one such is shown in FIG. 3b where a p-n junction 36 is formed along the interface between a p+ type semi-conductor substrate 37 and the layer 38 of n-type semi-conductor material. A narrow p type barrier 39 separates the layer 38 from another n type layer 41. Thus in this device the intrinsic material is replaced by n-type material. While the two layers 38 and 41 usually have the same dopant concentration, other relative concentrations may be used. However in order to ensure that an off state occurs the dopant concentration in the layer 38 should not be more than about twice that in the layer 41, otherwise both the junction and the barrier are always forward biassed. Contacts 42 and 43 are provided for the device and a layer 44 protects the upper surface of the device. For example when the substrate 37 is silicon the layer 40 is usually silicon dioxide.

The p type barrier 39 is formed, for example, by ion implantation or, if the device is to be implemented in GaAs by constructing a planar doped barrier using molecular beam epitaxy.

The operation of the device of FIG. 3b is similar to that of FIG. 1 and regenerative switching occurs with variation in applied forward bias for the p-n junction 36.

In devices of the type shown in FIG. 3b, the concentration of dopant in the substrate 37 may be about $10^{18}$ atoms per cm.$^{-3}$, the layer 38 may be between 0.5 to 5 microns in thickness and have a dopant concentration of between $10^{15}$ and $10^{16}$ per cm.$^3$, the barrier 39 may be between 100 and 1000 Å in thickness and have a dopant concentration of about $10^{12}$ atoms per cm.$^2$, and the layer 41 may have a dopant concentration of $10^{16}$ to $10^{17}$ atoms per cm.$^3$.

A further example of a device according to the invention has the same general form as that shown in FIG. 3b but in this case the layer 41 is heavily negatively doped while the layer 38 is only lightly negatively doped. In order to ensure that an "off" state is obtained when the p-n junction is lightly forward biassed it is necessary that the layer 38 is not substantially more heavily doped than the layer 41.

While the equations given above do not apply to the device of FIG. 3b since there are no intrinsic layers corresponding to the dimensions $d_1$ and $d_2$, a similar effect is obtained due to the relative densities of donor atoms in the layers 38 and 41.

Figure 4A:
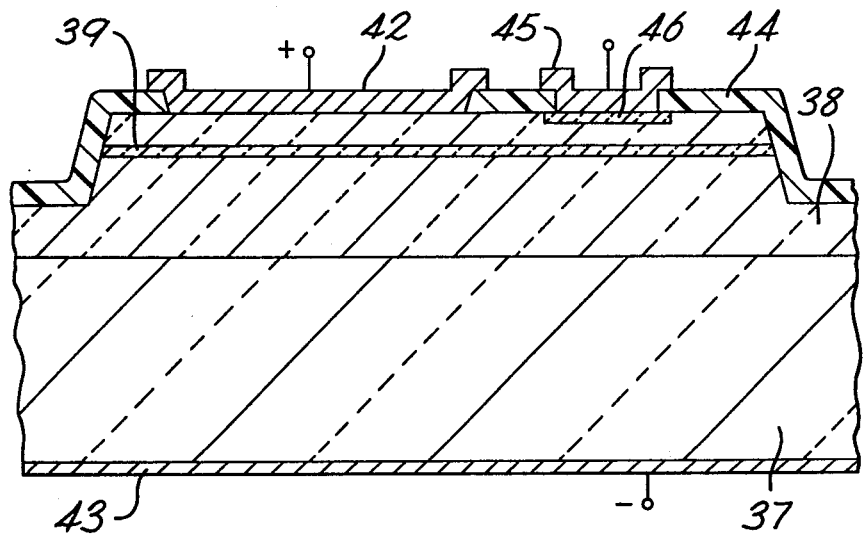
FIGS. 4a and 4b are cross sections of three terminal solid state switches according to the invention.
Figure 4B:
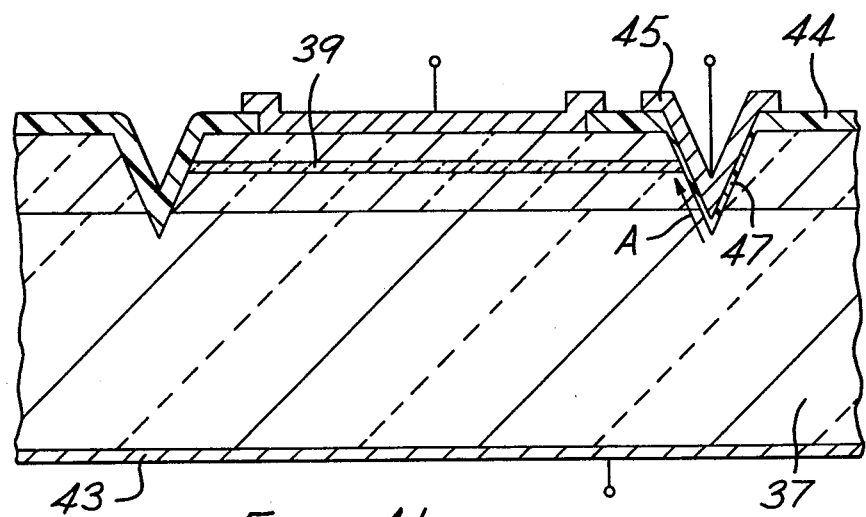

Embodiments of three terminal devices according to the invention and suitable for power applications are shown in FIGS. 4a and 4b. These devices have the same general form as the device of FIG. 3b but with the addition of gate terminals 45 in different forms for the injection of holes into the barrier region. Where portions of the devices of FIGS. 4a and 4b have the same functions as in FIG. 3b they are designated in the same way.

In FIG. 4a a small p+ diffusion 46 is located under the gate terminal 45. In power applications it is required to operate the switching device by means of a trigger voltage rather than by changing the bias across the device. Normal operating bias for the device of FIG. 4a is with the electrode 42 more positive than the electrode 43. When a triggering voltage which is positive with respect to the electrode 43 is applied to the gate 45 holes are injected from the p+ diffusion 46 into the barrier region. Thus the barrier height as given in equation 1 is reduced and provided sufficient holes are injected regenerative switching on commences. Switch off is by reduction of reverse bias as in the arrangement of FIG. 3a, and is similar to the action which takes place in a thyristor when the voltage across the thyristor falls to zero.

In the device of FIG. 4b the gate 45 and a surrounding silicon dioxide layer 47 projects in one region past the barrier 39 and into the p type substrate 37. In the region of the arrow A an insulated gate field effect transistor is in effect set up so that when the gate terminal 45 is suitably biassed holes travel along an induced channel corresponding to the arrow A to the barrier 39 so reducing its height. Switch on then occurs as described for previously mentioned devices. Switch off is again by the reverse bias across the device between the electrodes 42 and 43 falling to zero.

While certain embodiments of the invention have been described it will be clear that the invention may be put into operation in many different ways as long as means for carrier injection and a barrier are provided. Other combinations of semi-conductor materials may be used and in particular the conductivities of the various layers of the devices specifically described may be reversed. Other arrangements using additional terminals and semi-conductor layers may also be constructed.

I claim:
1. A switching device comprising:
a body of semi-conductor material,
means for injecting carriers of one type into the body,
a first terminal coupled to the said means, a barrier region of the body formed by semi-conductor material having the said one type of carriers as majority carriers, and barrier region separating adjacent first and second further regions of the body, with the first region between the said means and the barrier region, and a second terminal coupled to the body on that side of the second region which is remote from the barrier region, the dimensions of the barrier region and its composition in relation to the first and second further regions being such that when the device is unbiassed the barrier region is substantially depleted of the said majority carriers, and the concentration of any majority carriers of opposite type to the said one type in the first further region being not substantially more than twice as great, when the device is unbiassed, than in the second further region.

2. A switching device according to claim 1 wherein the first and second regions include intrinsic material adjacent to the barrier region, and the device is constructed to ensure that for a practical switching voltage applied between the first and second terminals, $G=1$, where $$G = \frac{2\alpha L_p}{C_j k T D_p} \frac{(A^*T^2)^2 e^{\frac{-q\phi}{kT}}}{\left(1 + \frac{q}{kT}(\phi_o - \phi)\right)} \text{ and}$$

$$\alpha \text{ is } \frac{q\delta}{\epsilon_s} \frac{d_1 d_2}{d_1 + d_2},$$

$d_1$ is the dimension of the intrinsic material of the first region between the barrier region and the means for injecting carriers, $d_2$ is the dimension of the intrinsic material of the second region between the barrier region and second terminal, $\delta$ is the average width of the free majority carrier density in the barrier region, $\epsilon_s$ is the permittivity of the intrinsic material, $L_p$ is diffusion length of the said majority carriers, k is Boltzmann's constant, $A^*$ is the effective Richardson constant for electrons, T is absolute temperature, q is electric charge, $D_p$ is the diffusion coefficient of the said majority carriers, $C_j$ is $$\frac{qLN_D}{4D_p}(\sigma V_{th} N_{tj} W)^2,$$

L is the length of the region between the barrier and the junction, $N_D$ is the density of impurity atoms in the region of the junction, $\sigma$ is the capture cross section for traps in the junction space charge region, $V_{th}$ is the terminal velocity for traps in the junction space charge region, $N_{tj}$ is the trap density for traps in the junction space charge region, W is the width of the junction space charge region, $\phi$ is the energy band barrier height due to the layer of semi-conductor material when the said switching voltage is applied, and $\phi_o$ is the energy band barrier height due to the said layer when no bias voltage is applied between the first and second terminals.

3. A switching device according to claim 1 wherein the means for injecting carriers is a semi-conductor junction.

4. A switching device according to claim 1 wherein
the first and second regions are of n-type material,
the means for injecting carriers, in operation, injects holes, and
the barrier region is formed of p-type material.

5. A switching device according to claim 1 wherein
the first and second regions are of p-type material,
the means for injecting carriers, in operation, injects electrons, and
the barrier region is formed of n-type material.

6. A switching device according to claim 1 wherein
the first and second regions are of intrinsic material,
the means for injecting carriers, in operation, injects holes,
the barrier region is formed of p-type material, and
the distance between the barrier region and the means for injecting carriers being at least twice as long as the distance between the barrier region and that part of the body to which the second terminal is coupled.

7. A switching device according to claim 1 wherein
the first and second regions are of intrinsic material,
the means for injecting carriers, in operation, injects electrons, and
the barrier is formed of n-type material.

8. A switching device according to claim 1 including
a substrate for the said body, the first terminal being connected by way of the substrate to the said body, and the said body being in the form of a layer on at least part of the substrate, and
a layer of insulating material covering the said body except where the second terminal makes contact therewith.

9. A switching device according to claim 1 including
a third terminal coupled to further means for injecting carriers of the said one type into the body at a position near to the barrier region.

10. A switching device according to claim 9 wherein
the said further means comprises a third further region in which the said one type of carriers are majority carriers, the third further region being located in said second further region.

11. A switching device according to claim 9 including
a substrate for the said body, the first terminal being connected by way of the substrate to the said body, and the said body being in the form of a layer on at least part of the substrate, and
a layer of insulating material covering the said body except where the second terminal makes contact therewith and where the third terminal is positioned,
the further means for injecting carriers including
an electrode connected to the third terminal, the electrode projecting from the layer of insulating material into the said body through the barrier region at least as far as the vicinity of the first mentioned means for injecting carriers of the said one type, and a layer of insulating material, separating the said electrode from the body, and of such dimensions and composition that the third terminal can be so biassed in relation to the other terminals that an induced channel for carriers of the said one type from the said other means to the said barrier is set up in the body.

12. A method of operating a switching device according to claim 1, comprising applying, when the device is to be substantially non-conducting, a first voltage between the first and second terminals, the voltage being of a polarity which causes the means for injecting carriers of the first type to tend to inject such carriers into the said body, and applying a second voltage of the said polarity between the first and second terminals when the device is to conduct, the second voltage being large in relation to the first voltage.

13. A method of operating a switching device according to claim 9, comprising applying a first voltage between the first and second terminals which is of a polarity which causes the means for injecting carriers, connected to the first terminal to tend to inject such carriers into the said body, applying, when the device is to be substantially non-conducting, a second voltage between the first and third terminals which is of a polarity which prevents the further means from injecting carriers of the first type, and applying, when the device is to conduct, a third voltage between the first and second terminals which is of the same polarity as the first voltage but is large relative thereto and a fourth voltage between the first and third terminals which causes the said further means to inject carriers of the first type into the said body.

* * * * *